US007643812B2

(12) United States Patent
Lai

(10) Patent No.: US 7,643,812 B2
(45) Date of Patent: Jan. 5, 2010

(54) METHOD AND APPARATUS FOR A SINGLE-PATH ENHANCED-ALGORITHM DIGITAL AUTOMATIC GAIN CONTROL INTEGRATED RECEIVER WITH POWER MANAGEMENT AND XM INTERFERENCE ENHANCEMENT

(75) Inventor: Yhean-Sen Lai, Warren, NJ (US)

(73) Assignee: Agere Systems Inc., Allentown, PA (US)

( * ) Notice: Subject to any disclaimer, the term of this patent is extended or adjusted under 35 U.S.C. 154(b) by 502 days.

(21) Appl. No.: 11/522,689

(22) Filed: Sep. 18, 2006

(65) Prior Publication Data

US 2008/0070534 A1   Mar. 20, 2008

(51) Int. Cl.
*H04B 1/06* (2006.01)
*H04B 7/00* (2006.01)

(52) U.S. Cl. .................. 455/232.1; 455/136; 455/234.1; 375/345

(58) Field of Classification Search ... 455/232.1–253.2, 455/136, 138; 375/345
See application file for complete search history.

(56) References Cited

U.S. PATENT DOCUMENTS

| | | | |
|---|---|---|---|
| 6,625,433 B1 * | 9/2003 | Poirier et al. ............. | 455/232.1 |
| 6,668,164 B2 * | 12/2003 | Hughes .................... | 455/234.1 |
| 6,728,524 B2 * | 4/2004 | Yamanaka et al. ........ | 455/232.1 |
| 7,062,243 B2 | 6/2006 | Simmons et al. | |
| 7,065,165 B2 | 6/2006 | Heinonen et al. | |
| 7,079,584 B2 | 7/2006 | Feher | |
| 7,099,688 B2 | 8/2006 | Wilson | |
| 7,106,232 B2 | 9/2006 | Harberts et al. | |
| 7,110,434 B2 | 9/2006 | Currivan et al. | |
| 7,110,735 B2 | 9/2006 | Abe | |
| 7,113,758 B2 * | 9/2006 | Kishi ....................... | 455/234.1 |
| 7,123,892 B2 | 10/2006 | Li et al. | |
| 7,136,622 B2 | 11/2006 | Rofougaran et al. | |
| 7,142,665 B2 | 11/2006 | Barron et al. | |
| 7,149,263 B2 | 12/2006 | Higure | |
| 7,359,690 B2 * | 4/2008 | Lai ......................... | 455/240.1 |
| 7,460,623 B1 * | 12/2008 | Radionov et al. .......... | 375/345 |
| 2007/0243843 A1 * | 10/2007 | Shalash ................... | 455/234.1 |
| 2008/0039041 A1 * | 2/2008 | Buchwald et al. ........ | 455/234.1 |

* cited by examiner

*Primary Examiner*—Simon D Nguyen

(57) ABSTRACT

A single-path enhanced-algorithm digital automatic gain control (SDAGC) integrated receiver is presented. The SDAGC has a front-end RF/IF reception/processing block and associated RF/IF AGC, which outputs to a single ADC. Output from the ADC is split into two TDM and one COFDM signal pathways, each with a respective DAGC. The TDM DAGCs are controlled according to TDM post-power signals, while the COFDM, DAGC is controlled according to COFDM post- and pre-power signals. An IF Gain Decision block determines the RF/IF gain based upon the respective gains of the TDM and COFDM DAGCs. A Gain Distributor block then distributes the total gain of the system across the RF/IF AGC and the various DAGCs. To save power, the COFDM pathways may be disabled if the COFDM pre-power signal falls below a threshold value.

15 Claims, 4 Drawing Sheets

METHOD AND APPARATUS FOR A SINGLE-PATH ENHANCED-ALGORITHM DIGITAL AUTOMATIC GAIN CONTROL INTEGRATED RECEIVER WITH POWER MANAGEMENT AND XM INTERFERENCE ENHANCEMENT

FIELD OF THE INVENTION

The present invention is generally directed to digital radio service reception and enhancement, and more particularly to a method and apparatus for a single-path enhanced-algorithm digital automatic gain control integrated receiver for receiving non-ionizing radiation waves in the electromagnetic spectrum.

BACKGROUND OF THE INVENTION

FIGS. 1 and 2 taken together illustrate in block diagram format the current structure of a car's audio receiver found in a Sirius™ Satellite Digital Audio Radio Service (SDARS) system (operating in the radio frequency (RF) spectrum 2.3-GHz "Short wave" S band, from 2320 to 2345 MHz). The SDARS system has two separate front end RF signal receiving paths, one acting as a time division multiplexing (TDM) receiver (shown in FIG. 1) and the other acting as a coded orthogonal frequency division multiplexing (COFDM) receiver (shown in FIG. 2). Thus the current system requires two separate automatic gain control (AGC) controllers, a TDM AGC and a COFDM AGC, to maintain for independent demodulation the received RF signal's corresponding signal levels (respectively referred to hereinafter as "SetPoint_TDM_dB_LSB" and "SetPoint_OFDM_dB_LSB").

Referring now specifically to FIG. 1, the TDM integrated receiver 1 of the SDARS is constructed of well-known electronic circuitry devices. RF signals (consisting of multiple digital signals or analog signals carrying digital data) are received by the TDM antenna 2 and routed to an antenna RF processing circuit 3 and an RF/IF processing circuit 4 where decoding of the radio signals begins. Input control of the automatic gain control of both the RF signals and intermediate frequency (IF) signals is handled by the TDM AGC controller 5. TDM AGC covers a dynamic power range for the TDM received RF signal of up to 75 dB. The TDM receiver signal path has a signal set-point value level defined as SetPoint_TDM_dB_LSB=(9.2+1.2) dB and this allows enough headroom to avoid any saturation happening at a 10-bit analog to digital converter (ADC) 6, which converts the RF signals to discrete digital numbers, even during TDM on-channel blocking.

After analog to digital conversion, the TDM received RF signal is routed to a digital down converter (DDC) 7 where it is split into two separate signals labeled as TDM1 and TDM2 as shown. The two signals are then separately demodulated by TDM1 demodulator 8 and TDM2 demodulator 9, respectively. The TDM received RF demodulated signal, indicated on FIG. 1 by reference labels TDM1 post-power and TDM2 post-power, are routed to the maximal function 10, which selects the maximal post power of TDM1 and TDM2 for output.

Hence, as can be seen for the TDM AGC, computation of the AGC gains required for the respective RF and IF processing circuits 3 and 4 are based solely upon the post-power level of TDM received RF signal after the maximal function 10.

With regard to control of the RF AGC gain in the TDM integrated receiver 1 of the SDARS, three rfstates (−1, 0, 1) are implemented with the initial state of the rfstates being set to 0. Any change of the rfstates depends on the information of the RF detector/direction sent from RF processing circuit 3. Additionally the step-size is 10 dB, and this means the RF AGC gain may be −10 dB, 0 dB or +10 dB. The IF AGC gain, on the other hand, ranges from −27.5 dB to +27.5 dB in 1 dB step-size. A Least Mean Square (LMS) algorithm is implemented to update the IF AGC gain. Both the RF AGC gain and the IF AGC gain are updated at 100 Hz normally, however, the updating frequency of the RF/IF AGC gains is reduced to 50 Hz to avoid problems associated with overshooting when the RF AGC gain changes.

Referring now specifically to FIG. 2, the COFDM integrated receiver 11 of the SDARS is likewise constructed of well-known electronic circuitry devices. After receipt of the COFDM RF signal (consisting of broadcast digital audio and/or video signals (DAB and DVB-T)) from the COFDM antenna 12, the antenna RF processing circuit 13, RF/IF processing circuit 14, 10-bit ADC 16, DDC 17 and COFDM demodulator 18 all operate similarly to their cousins in the TDM integrated receiver, albeit with the COFDM demodulator 18 utilizing Fast Fourier Transform implementations for integration purposes. COFDM AGC, however, covers a dynamic power range for the COFDM received RF signal of up to 131 dB, and the set-point values in COFDM pre-power and post-power are (32.2+3.0+10=45.2 dB) and (32.2+3.0=35.2 dB), respectively. The pre-power, which includes the power of un-used tones, interference noise and others, is set to 10 dB higher than the post-power.

Hence, as can be seen for the COFDM AGC, computation for the COFDM AGC controller 15 to adjust the gain levels in RF and IF processing circuits 13 and 14 require both pre-power input from the DDC 17 and post-power input from COFDM demodulator 18.

With regard to control of the RF AGC gain in the COFDM integrated receiver 11 of the SDARS, five rfstates (1, 2, 3, 4, 5) are implemented with the initial state of the rfstates being set to 3. Any change of rfstates depends on the information of RF detector/direction from RF processing circuit 13. Additionally the step-size is 15 dB, and this means the RF AGC gain may be −30 dB, −15 dB, 0 dB, +15 dB or +30 dB. The IF AGC gain, on the other hand, ranges from −35.5 dB to +35.5 dB with a 1 dB step-size. An LMS algorithm is implemented to update the IF AGC gain. Both RF AGC gain and IF AGC gain are updated at 100 Hz normally, however, the updating frequency for the RF/IF AGC gains is reduced to 50 Hz to avoid overshooting problem while the RF AGC gain changes.

As can be seen then, two independent ADC controllers are needed by the SDARS system to complete the signal processing and maintain adequate performance over a range of input signal levels. Power consumption by the system, relatively speaking, is high, and operational specifications indicate there is room for increased performance. The next generation SDARS systems will need to provide better performance with lower power consumption characteristics at reduced costs.

SUMMARY OF THE INVENTION

Accordingly, the present invention addresses these problems by employing a new single-path enhanced-algorithm digital automatic gain control (SDAGC) integrated receiver circuit.

The SDAGC circuit has a digital automatic gain control (DAGC) circuit that has a single-path circuit architecture, thereby eliminating the need for dual Antenna RF Processors, dual RF/IF Processors and dual ADCs, and which thereby leads to lower manufacturing costs and reduced power consumption. In addition, the SDAGC circuit also has an enhanced algorithm for gain control computation in the AGC controllers (which allows for XM satellite radio channel interference handling while boosting XS satellite radio channel reception), thus leading to improved system performance, and has a power estimation algorithm to allow for the enabling/disabling of the COFDM receiver for power consumption purposes.

The present invention, including its features and advantages, will become more apparent from the following detailed description with reference to the accompanying drawings.

DETAILED DESCRIPTION

Figure 3:
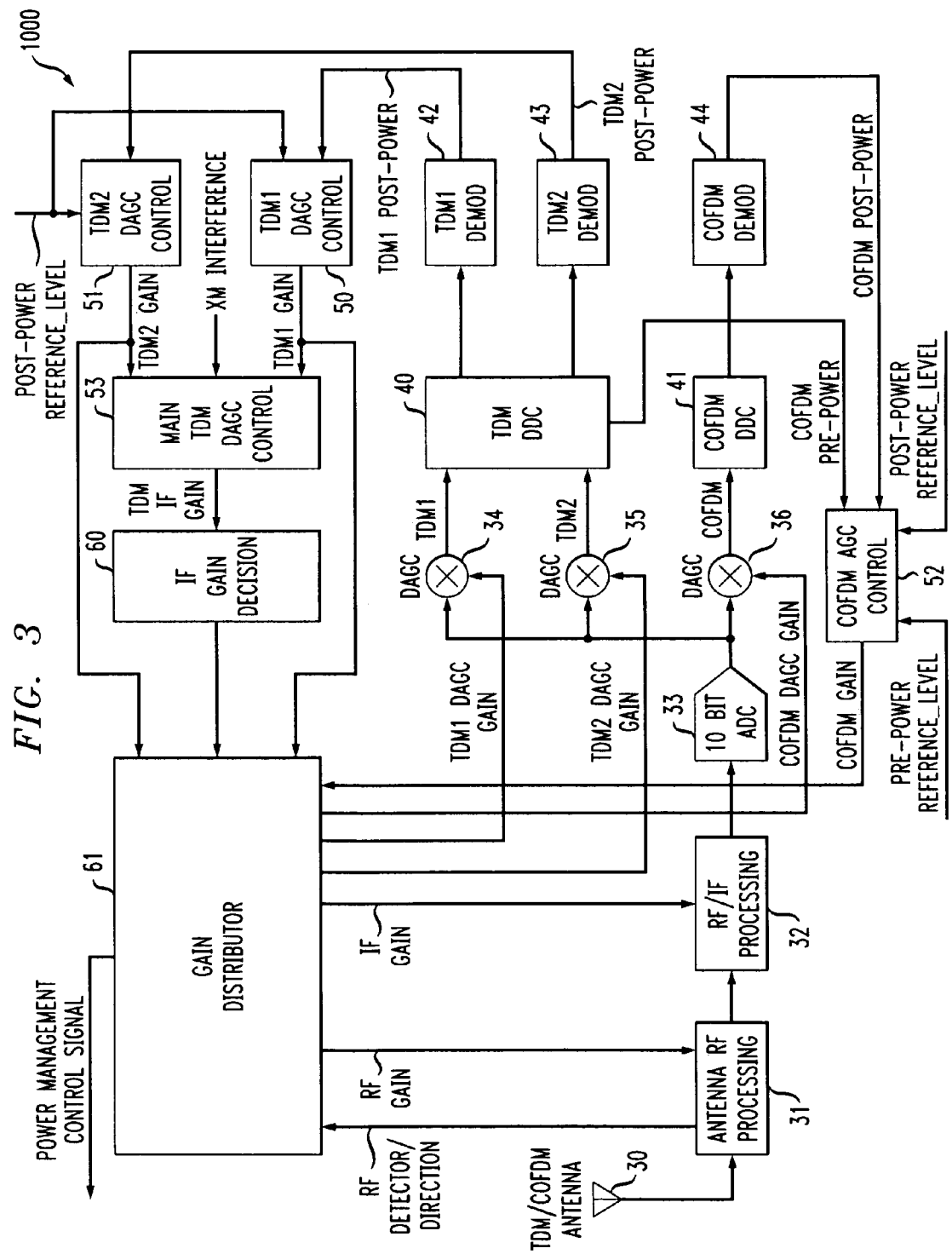
FIG. 3 is an illustration in block diagram of the architecture of a single path digital automatic gain control circuit, according to an embodiment of the present invention.
Figure 4:
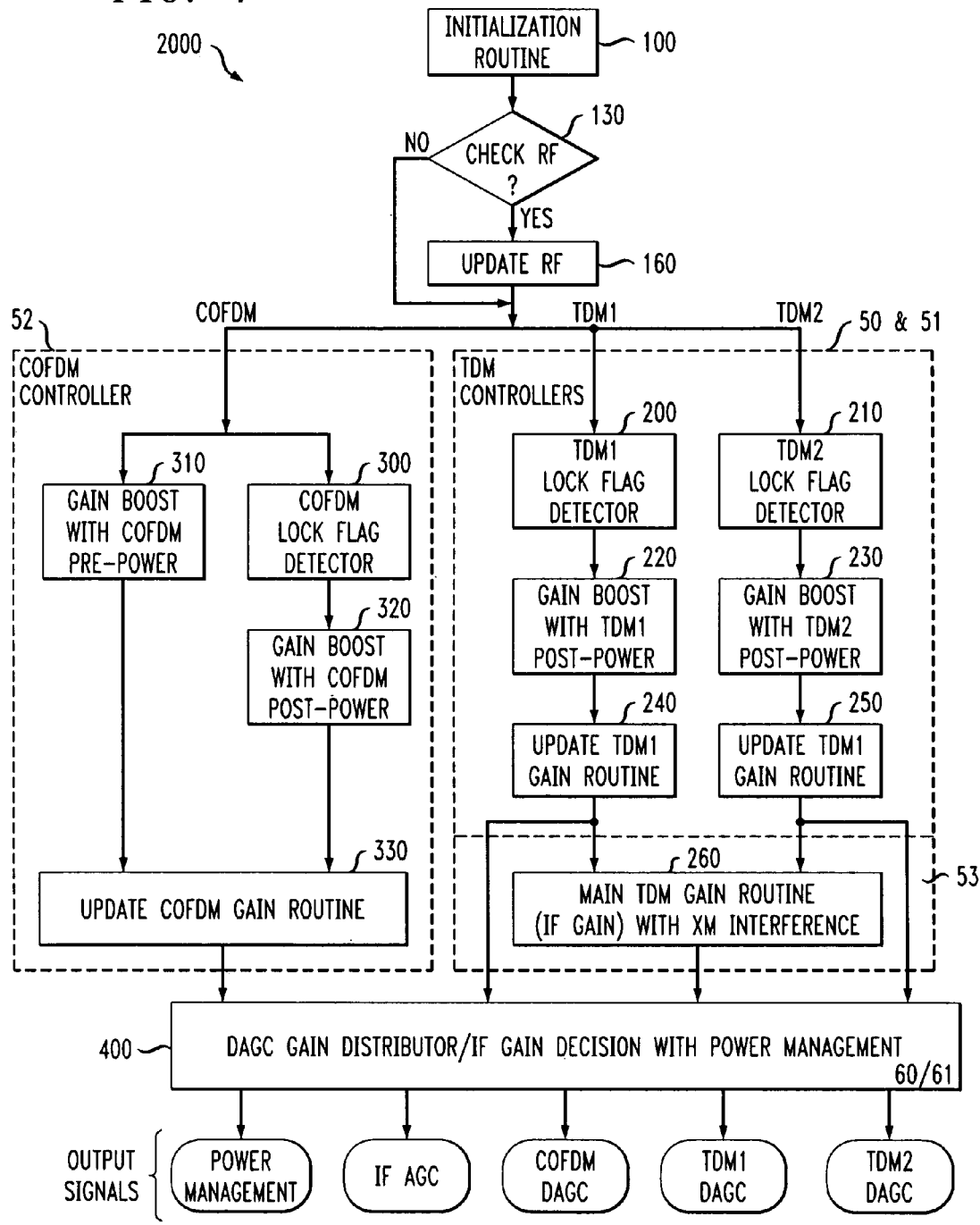
FIG. 4 is an illustration of a flowchart of the enhanced algorithm methodology utilizing by a single path digital automatic gain control circuit, according to an embodiment of the present invention.

FIGS. 3 and 4 illustrate the device architecture and corresponding software algorithm flowcharts of a single-path enhanced-algorithm digital automatic gain control (SDAGC) circuit for a next generation SDARS system that has improved system performance, a lower power consumption and a lower manufacturing cost than the current systems.

Figure 1:
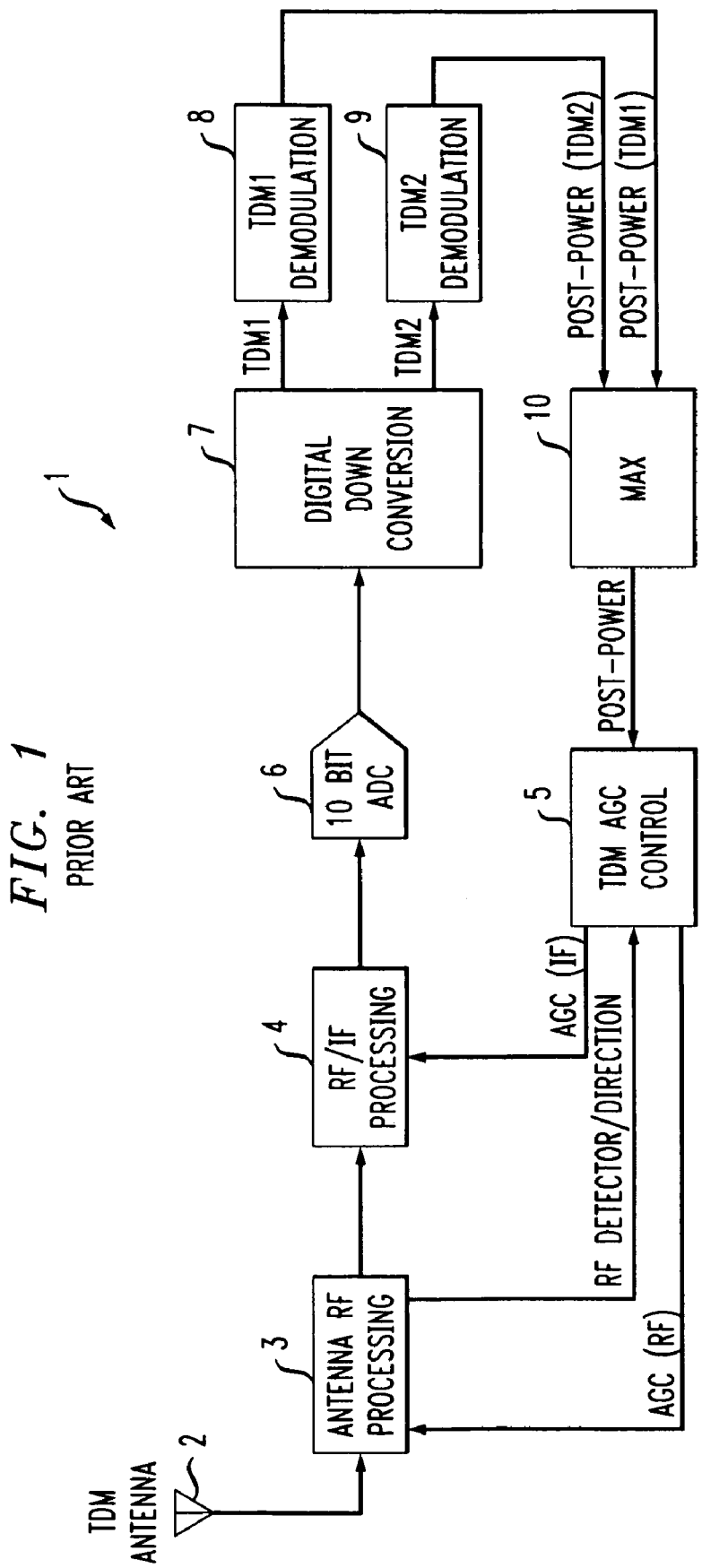
FIG. 1 is an illustration in block diagram of a time division multiplexing RF front end signal path for a Satellite Digital Audio Radio Service, according to the prior art.
Figure 2:
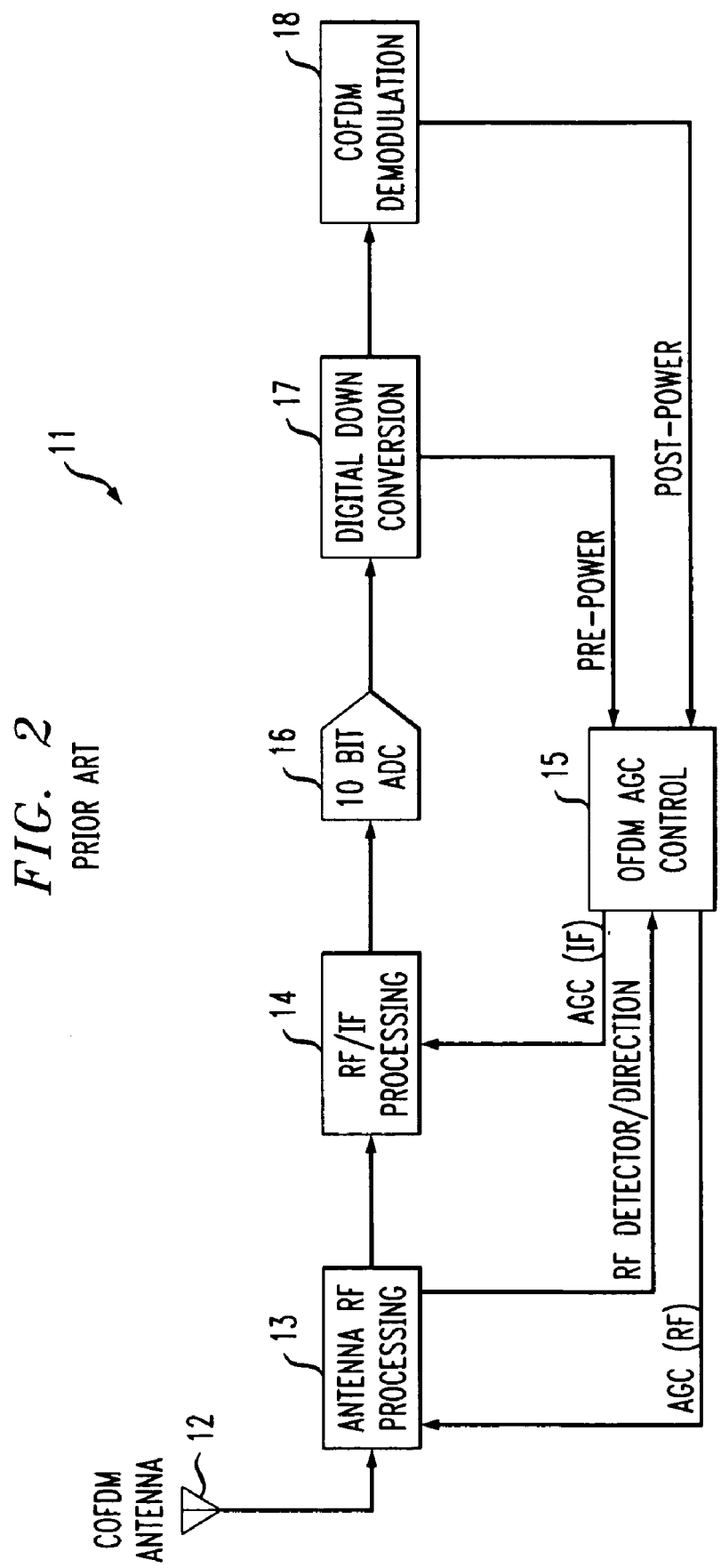
FIG. 2 is an illustration in block diagram of a coded orthogonal frequency-division multiplexing RF front end signal path for a Satellite Digital Audio Radio Service, according to the prior art.

As can be seen from a comparison of the architecture shown in FIG. 3 with the combined architecture of FIGS. 1 and 2, the SDAGC circuit has fewer electronic device components at the front end of the processing circuit. That is, the chips required by the prior art for the antenna, antenna RF processing and RF/IF processing of the COFDM system are eliminated.

Additionally, the SDAGC circuit has only one ADC to handle both the TDM RF and COFDM RF signal paths. The resultant single path circuit architecture of the DAGC in the next-generation SDARS system is accomplished by the use of enhanced algorithms implemented in software, in either an ASIC or C programming language (or the like), in 32-bit advanced RISC machine (ARM) processors, or any other suitable processor. The ARM performs AGC control by monitoring signal levels at several points in the system, executing a gain control algorithm, and then applying the resulting gain settings to the RF and IF ASICs. Multiple processors allow for the algorithms to be run in parallel, thus taking advantage of the circuit architecture (i.e., allowing for several processors to work on the differing algorithms at the same time, and even divide information amongst themselves into more symmetrical or asymmetrical sub-problems to combine the results back together at one end). Accordingly, AGC control for the TDM and COFDM signal paths may be performed independently, despite the presence of a single front-end for both the TDM and COFDM pathways.

Referring now specifically to FIGS. 3 and 4, operation of the SDAGC circuit 1000 and the processing algorithms 2000 will now be detailed. To maintain the full dynamic range of a combined signal of TDM1/TDM2 and COFDM, the circuitry will be simplified as the RF and IF AGC have +/−10 dB and +/−35.5 dB ranges respectively.

RF processing begins at the output of the combined TDM/COFDM antenna 30, which is capable of receiving satellite (TDM) pickup and terrestrial (COFDM) pickup. The antenna output is fed to the antenna RF processing circuit 31 where each of the TDM and COFDM signals are passed through a low noise amplifier (LNA) and RF filter. The LNA is AGC controlled.

Control of the RF AGC gain is implemented upon initialization of the algorithm in step 100. Therein three rfstates (−1, 0, 1) are implemented to control RF AGC gain, with the initial state of the rfstates being set to 0. Change of rfstates depends on the information of the RF detector/direction sent from the RF processing block 31. As accomplished by the algorithm below, the RF AGC gain is checked in step 130 and updated in step 160.

Step 100: Set initial value: Rfstate_current=0.

Steps 130 and 160:

$$\text{Rfstate\_next} = \begin{cases} \text{Rfstate\_current}++ & \text{if direction} == 1 \\ \text{Rfstate\_current}-- & \text{if direction} == -1 \end{cases}$$

$$\text{Rfstate\_next} = \begin{cases} 1 & \text{if Rfstate\_next} \geq 1 \\ -1 & \text{if Rfstate\_next} \leq -1 \end{cases}$$

Rfstate_current=Rfstate_next for the next updating.

$$\text{Rfgain} = \begin{cases} 10 \text{ dB} & \text{if Rfstate\_current} == 1 \\ 0 \text{ dB} & \text{if Rfstate\_current} == 0 \\ -10 \text{ dB} & \text{if Rfstate\_current} == -1 \end{cases}$$

As shown, the step-size is 10 dB, and this means the RF AGC gain may be −10 dB, 0 dB or +10 dB. At this point in the RF processing the signals are at a first IF of 315 MHz.

IF processing begins as each amplified and filtered signal is then sent to the RF/IF processing circuit 32. The signals are passed through an IF AGC amplifier, IF filter, and first down-converter to a final IF of 75 MHz. The IF AGC gain ranges from −35.5 dB to +35.5 dB with 1 dB step-sizes. The IF filters for the COFDM signal will have a narrower bandwidth than the IF filters for the TDM path allowing reception of the COFDM signal in a harsher interference environment than the TDM signals. The COFDM filter bandwidths can be on the order of 4.2 MHz, while the TDM filters must have a 12.5 MHz bandwidth in order to pass both TDM signals.

The TDM and COFDM signals, having been band-pass filtered and AGC amplified, are applied to the 10-bit ADC 33. Here the signals are converted to a 10-bit digital signal sampled at 60 MHz. It is to be understood, of course, that a 12-bit resolution ADC may also be used. As the TDM signal has been separated into its two components (TDM1, TDM2), three digital AGCs (DAGC) 34, 35 and 36 are used to adjust the now three input signals (TDM1, TDM2 and COFDM) to the required levels for the corresponding TDM1, TDM2 and COFDM systems. The DAGCs are actually multipliers.

Thereafter the two signals TDM1 and TDM2 are passed through TDM DDC 40 and the COFDM signal is passed through COFDM DDC 41. Each of the two DDCs separates the two TDM sub-bands and COFDM, respectively, from the full 12.5 MHz Sirius™ Satellite Radio signal bandwidth. In other words, each pass band signal is brought to a base band signal so that the three signals can be applied to the appropriate digital receiver processing chain. Such conversion is accomplished through a combination of Hilbert transformation, band-shifting, fixed decimation, and controlled variable re-sampling.

Each signal, having passed through their respective DDC, is passed to a demodulator. TDM1 is passed through TDM1 Demodulator 42, TDM2 is passed through TDM2 Demodulator 43, and the COFDM signal is passed through COFDM Demodulator 44. The front end of the TDM demodulator 42, 43 is a matched filter, which is a symmetrical root-raised cosine filter, while the COFDM demodulator 44 is an FFT-based receiver.

The TDM demodulators 42 and 43 extract soft QPSK symbols in (I,Q) format from the input sample stream using a synchronous receiver. In so doing, it accomplishes the major functions common to most such demodulators by performing: matched filtering; timing error detection; frame synchronization; carrier synchronization; decision feedback equalization; and timing and framing acquisition.

The COFDM demodulator 44 extracts soft QPSK symbols in (I,Q) format from the input sample stream using an FFT-based receiver. Sub-functions employed in the basic demodulation process are: timing error detection; frequency offset detection (gross and fine); frequency offset compensation; Fourier transformation with time and frequency pruning; carrier synchronization and differential demodulation; frequency de-interleaving; and QPSK phase correction.

Processing DAGC control by TDM1 DAGC controller 50, TDM2 DAGC controller 51, and COFDM DAGC controller 52 is discussed next. These DAGC controllers update the gains of the TDM1, TDM2 and COFDM single paths to achieve the input signal of the corresponding path to the respective reference level. Both TDM1 and TDM2 only use a same reference level for the post-power. The COFDM path uses pre-power and post-power reference levels to monitor its pre-power and post-power signals.

TDM DAGC processing control occurs in the TDM1 DAGC controller 50 and the TDM2 DAGC controller 51 in parallel processing in steps 200-250. In steps 200 and 210 the lockflag is detected through the following algorithm:

```
Initial value: LockFlag = 0.
The value of LockFlag in other state is updated in the following steps:
InSignal = InputPower − TDMSetPoint
InSignal = ((InSignal > 0) ? − InSignal : InSignal)
if (LockFlag == FALSE)
    if (InSignal > LIMIT_OUT_OF_LOCK)
        LockFlag = TRUE
else
    if (InSignal < LIMIT_IN_LOCK)
        LockFlag = FALSE
```

In steps 220 and 230, a TDM1/TDM2 GainBoost routine is run to generate the value of the step-size in order to update, in steps 240 and 250, the TDM1/TDM2 Gain Routine for changing the total gain of TDM 1 and TDM2. The GainBoost routines, in steps 220 and 230, bases upon the information of TDM1/TDM2 post-power changes to classify the AGC system to be one of acquisition, transition or steady states. Each state of acquisition, transition and steady states generates its own specific step-size for AGC routine to update the AGC gain. Of course, the step-size of acquisition state will be higher than that of steady state.

COFDM DAGC processing control occurs in the COFDM controller 52 in processing steps 300-330. In step 300 the lockflag is detected through the following algorithm:

```
Initial value: LockFlag = 0.
The value of LockFlag in other state is updated in the following steps:
InSignal = InputPower − COFDMSetPoint
If (fabs(InSignal) < 20.0)
    LockFlag = 1
else
    LockFlag = 0
```

In steps 310 and 320, COFDM GainBoost routine is run to generate the value of the step-size in order to update, in step 330, the COFDM Gain Routine for changing the total gain of COFDM.

The main TDM DAGC control circuit 53 determines the necessary gain for the IF AGC to reach an high overall performance for the TDM system. The decision is based upon input of the XM interference factor, TDM1 gain and TDM2 gain.

In step 260, an algorithm is run that determines the value for the gain of the IF AGC based upon the total gains of TDM1 and TDM2 in conjunction with the information of XM interference at TDM2. The algorithm for such is shown in the following:

```
if (( ftdm1DagcUpdate − ftdm2DagcUpdate ) < JT _INT ) {
    if ( ftdm1DagcUpdate > ftdm2DagcUpdate )
        max ftdmDagcUpdate = ftdm2DagcUpdate
}
else if (( ftdm1DagcUpdate − ftdm2DagcUpdate ) < M2JT _INT ) {
    max ftdmDagcUpdate = ( ftdm1DagcUpdate + ftdm2DagcUpdate ) / 2
}
else {
    max ftdmDagcUpdate = ftdm1DagcUpdate + M2JTADJUST _INT
}
```

With the TDM IF gain and COFDM IF gain derived from the above algorithms, the IF gain decision circuit 60 will decide what value of the actual IF gain will be allocated to the IF AGC. After the actual IF gain is determined, the gain distributor circuit 61 is responsible for distributing the remaining gain of the TDM1, TDM2 and COFDM signal paths into their corresponding DAGC 34, 35 and 36. At the same time, the gain distributor circuit 61 also determines whether or not to turn off the COFDM path based upon the COFDM gain. A similar concept can be applied to the TDM system too. Thus, the TDM system can be turned off in a strong COFDM area.

In step 400, the following algorithm distributes the total gain of each path (TDM 1, TDM2 and COFDM) into one IF gain and its corresponding DAGC, and, at the same time, also determine whether or not to turn off the operation of COFDM system based upon the total gain of the COFDM:

```
if (Cofdm PrePower≧EnableCofdmThreshhold) {
    PowerManagementEnable=0
}
else {
    PowerManagementEnable=1
}
if(PowerManagementEnable=0) {
    If ( fcofdmDagcUpdate≦ COFDM _GAIN_THRESHOLD\) {
        IF_Gain=max ftdmDagcUpdate
    }
    else if (COFDM_GAIN_THRESHOLD\<
        fcofdmDagcUpdate≦COFDM_GAIN_THRESHOLD2)
```

-continued

```
        IF_Gain=(maxftdmDagcUpdate+ fcofdmDagcUpdate)/2
    else
        IF_Gain=fcofdmDagcUpdate
        cofdmDagcUpdate = fcofdmDagcUpdate – IF _Gain
        tdm1DagcUpdate = ftdm1DagcUpdate – IF _Gain
        tdm2DagcUpdate = ftdm2DagcUpdate – IF _Gain
    }
    else {
        IF _Gain = max ftdmDagcUpdate
        tdm1DagcUpdate = ftdm1DagcUpdate – IF _Gain
        tdm2DagcUpdate = ftdm2DagcUpdate – IF _Gain
    }
```

Thus, as can be seen from the above disclosure, the present invention clearly and conclusively improves system performance, has a lower power consumption and a lower manufacturing cost than the current systems.

In the foregoing description, the method and apparatus of the present invention have been described with reference to a specific example. It is to be understood and expected that variations in the principles of the method and apparatus herein disclosed may be made by one skilled in the art and it is intended that such modifications, changes, and substitutions are to be included within the scope of the present invention as set forth in the appended claims. The specification and the drawings are accordingly to be regarded in an illustrative rather than in a restrictive sense.

What is claimed is:

1. An apparatus for a radio receiver, the apparatus comprising:
    an RF processor providing a first IF output according to an RF signal received from an antenna;
    an RF/IF processor providing a second IF output from the first IF output according to an IF gain signal;
    an ADC for converting the second IF output to a digital output;
    a first signal processing pathway for processing the digital output of the ADC according to a first multiplexing method, and comprising a first DAGC for level-adjusting the digital output of the ADC according to a first DAGC signal;
    a second signal processing pathway for processing the digital output of the ADC according to a second multiplexing method, and comprising a second DAGC for level adjusting the digital output of the ADC according ton second DAGC signal;
    an IF gain decision circuit for determining an IF gain value for the RF/IF processor;
    a first DAGC control circuit for determining a first DAGC gain value for the first DAGC;
    a second DAGC control circuit for determining a second DAGC gain value for the second DAGC; and
    a gain distributor for controlling the IF gain signal, the first DAGC signal and the second DAGC signal according to the IF gain value, first DAGC gain value and second DAGC value,
    wherein the first multiplexing method is time-division multiplexing (TDM), and the second multiplexing method is coded orthogonal frequency-division multiplexing (COFDM).

2. The apparatus according to claim 1, wherein the gain distributor sets the IF gain signal to the IF gain value, sets the first DAGC signal to the first DAGC gain value less the IF gain value, and sets the second DAGC signal to the second DAGC gain value less the IF gain value.

3. The apparatus according to claim 1, wherein the IF gain decision circuit utilizes the first DAGC gain value and the second DAGC gain value to set the IF gain value.

4. The apparatus according to claim 1, the apparatus further comprising:
    a third signal processing pathway for processing the digital output of the ADC according to a third multiplexing method and comprising a third DAGC for level-adjusting the digital output of the ADC according to a third DAGC signal;
    a third DAGC control circuit for determining a third DAGC gain value for the third DAGC;
    wherein the gain distributor further controls the third DAGC signal according to the IF gain value, the first DAGC gain value, the second DAGC gain value and the third DAGC gain value.

5. The apparatus according to claim 4, wherein the gain distributor sets the IF gain signal to the IF gain value, sets the first DAGC signal to the first DAGC gain value less the IF gain value, sets the second DAGC signal to the second DAGC gain value less the IF gain value and sets the third DAGC signal to the third DAGC gain value less the IF gain value.

6. The apparatus according to claim 5, wherein the IF gain decision circuit utilizes the first DAGC gain value and a function of the second DAGC gain value and the third DAGC gain value to set the IF gain value.

7. The apparatus according to claim 1, further comprising:
    a power management circuit for disabling the first signal processing pathway according to a power signal output from the first signal processing pathway.

8. A method of receiving an RF carrier wave encoded with a first multiplexed signal and a second multiplexed signal, the method comprising:
    generating a first IF signal from the RF carrier wave;
    determining a first gain value for demodulating the first multiplexed signal;
    determining a second gain value for demodulating the second multiplexed signal;
    determining an IF gain value utilizing the first gain value and the second gain value;
    amplifying the first signal by the IF gain value to generate a second IF signal;
    converting the second IF signal into a source digital signal;
    generating a first digital signal by multiplying the source digital signal by the approximate difference of the first gain value and the IF gain value;
    generating a second digital signal by multiplying the source digital signal by the approximate difference of the second gain value and the IF gain value;
    performing a first demodulation process on the first digital signal; and
    performing a second demodulation process on the second digital signal
    wherein the first multiplexing method is time-division multiplexing (TDM), and the second multiplexing method is coded orthogonal frequency-division multiplexing (COFDM).

9. The method according to claim 8, wherein determining the first gain value comprises:
    setting the first gain value according to at least a post-power value of the first multiplexed signal.

10. The method according to claim 9, wherein determining the first gain value further comprises:
    setting the first gain value according to a pre-power value of the first multiplexed signal.

11. The method according to claim 8, wherein determining the second gain value comprises:

setting the second gain value according to at least a post-power value of the second multiplexed signal.

12. The method according to claim 11, wherein determining the second gain value further comprises:
setting the second gain value according to an interference value.

13. An apparatus for a radio receiver, the apparatus comprising:
an RF processor providing a first IF output according to an RF signal received from an antenna;
an RF/IF processor providing a second IF output from the first IF output according to an IF gain signal;
an ADC for converting the second IF output to a digital output;
a first signal processing pathway for processing the digital output of the ADC according to a first multiplexing method, and comprising a first DAGC for level-adjusting the digital output of the ADC according to a first DAGC signal;
a second signal processing pathway for processing the digital output of the ADC according to a second multiplexing method, and comprising a second DAGC for level adjusting the digital output of the ADC according to a second DAGC signal;
an IF gain decision circuit for determining an IF gain value for the RF/IF processor;
a first DAGC control circuit for determining a first DAGC gain value for the first DAGC;
a second DAGC control circuit for determining a second DAGC gain value for the second DAGC;
a gain distributor for controlling the IF gain signal, the first DAGC signal and the second DAGC signal according to the IF gain value, first DAGC gain value and second DAGC value;
a third signal processing pathway for processing the digital output of the ADC according to a third multiplexing method and comprising a third DAGC for level-adjusting the digital output of the ADC according to a third DAGC signal; and
a third DAGC control circuit for determining a third DAGC gain value for the third DAGC;
wherein the gain distributor further controls the third DAGC signal according to the IF gain value, the first DAGC gain value, the second DAGC gain value and the third DAGC gain value.

14. The apparatus according to claim 13, wherein the gain distributor sets the IF gain signal to the IF gain value, sets the first DAGC signal to the first DAGC gain value less the IF gain value, sets the second DAGC signal to the second DAGC gain value less the IF gain value and sets the third DAGC signal to the third DAGC gain value less the IF gain value.

15. The apparatus according to claim 14, wherein the IF gain decision circuit utilizes the first DAGC gain value and a function of the second DAGC gain value and the third DAGC gain value to set the IF gain value.

* * * * *